(12) United States Patent
Hammes et al.

(10) Patent No.: US 7,010,063 B2
(45) Date of Patent: Mar. 7, 2006

(54) RECEIVER CIRCUIT AND METHOD OF PROCESSING A RECEIVED SIGNAL

(75) Inventors: Markus Hammes, Dinslaken (DE); Andre Neubauer, Krefeld (DE)

(73) Assignee: Infineon Technologies AG, Munich (DE)

( * ) Notice: Subject to any disclaimer, the term of this patent is extended or adjusted under 35 U.S.C. 154(b) by 385 days.

(21) Appl. No.: 10/455,051

(22) Filed: Jun. 5, 2003

(65) Prior Publication Data
US 2003/0215028 A1    Nov. 20, 2003

Related U.S. Application Data

(63) Continuation of application No. PCT/DE01/04613, filed on Dec. 3, 2001.

(30) Foreign Application Priority Data
Dec. 5, 2000    (DE) ................. 100 60 425

(51) Int. Cl.
*H04L 27/14*    (2006.01)
(52) U.S. Cl. .................. 375/334; 375/350; 375/355
(58) Field of Classification Search ........ 375/229–236, 375/334–337, 350, 355; 329/300
See application file for complete search history.

(56) References Cited

U.S. PATENT DOCUMENTS

| | | | |
|---|---|---|---|
| 4,425,665 A | | 1/1984 | Stauffer |
| 5,481,564 A | * | 1/1996 | Kakuishi et al. ............ 375/230 |
| 5,493,721 A | | 2/1996 | Reis |
| 5,721,756 A | | 2/1998 | Liebetreu et al. |
| 6,226,322 B1 | * | 5/2001 | Mukherjee ................. 375/229 |
| 2002/0176517 A1 | | 11/2002 | Neubauer et al. |

FOREIGN PATENT DOCUMENTS

| | | |
|---|---|---|
| DE | 42 37 692 C1 | 3/1994 |
| DE | 199 60 559 A1 | 7/2001 |
| WO | 98/11672 | 3/1998 |
| WO | 99/33234 | 7/1999 |

OTHER PUBLICATIONS

Kammeyer, K. D.: "Nachrichtenübertragung" [Message Transfer], B. G. Teubner, Stuttgart, 1992, pp. 492-497.
Jack P.F. Glas: "A Differential FM Detector for Low-IF-Radios", *VTC '99, IEEE*, pp. 658-622.

* cited by examiner

*Primary Examiner*—Don N. Vo
(74) *Attorney, Agent, or Firm*—Laurence A. Greenberg; Werner H. Stemer; Ralph E. Locher

(57) ABSTRACT

A receiver circuit of a cordless communication system has an analog signal processing section with a channel selection filter and a digital signal processing section which is connected downstream of the latter and has a group delay equalizer. The group delay equalizer is used to equalize the digital distortion caused by the channel selection filter.

9 Claims, 1 Drawing Sheet

RECEIVER CIRCUIT AND METHOD OF PROCESSING A RECEIVED SIGNAL

CROSS-REFERENCE TO RELATED APPLICATIONS

This application is a continuation of copending International Application No. PCT/DE01/04613, filed Dec. 3, 2001, which designated the United States and was not published in English.

BACKGROUND OF THE INVENTION

Field of the Invention

The invention relates to a receiver circuit for a cordless communication system, in particular for a cordless telephone, and a method for processing a received signal in a cordless communication system.

Cordless digital communication systems such as, for example, DECT, WDCT, Bluetooth, SWAP, WLAN IEEE802.11 require suitable receivers to receive in a cordless fashion the radio-frequency signals which are transmitted via the air interface and which supply the demodulator with a baseband signal which is as free as possible of distortion in a way which is favorable in terms of expenditure. As well as a high degree of sensitivity, a high degree of integration, low costs, low power consumption and flexibility in terms of the applicability for various digital communication systems are desired here. In order to exploit the advantages of digital circuit technology (no drifts, no aging, no temperature-dependence, precise reproducibility), at least a part of the receiver circuit is implemented in the form of digital signal processing elements in this context. It is possible here for signal distortions whose characteristic depends on the signal processing elements used (analog and digital) to occur both in the analog signal processing section (referred to as analog receiver front end) and in the digital signal processing section. Such signal distortions reduce the power efficiency of the receiver, i.e. they adversely affect the sensitivity and the range of the receiver for a given bit error rate.

SUMMARY OF THE INVENTION

It is accordingly an object of the invention to provide a receiver circuit and a method of processing a received circuit that overcome the above-mentioned disadvantages of the prior art devices and methods of this general type, which has a high power efficiency, in particular for frequency shift keying (FSK) modulated signals.

With the foregoing and other objects in view there is provided, in accordance with the invention, a receiver circuit for a cordless communication system. The receiver circuit contains an analog signal processing section having a channel selection filter and a digital signal processing section connected downstream of the analog signal process section. The digital signal processing section has a group delay equalizer for equalizing at least signal distortion caused by the channel selection filter. A limiter is connected to the analog processing section. A sampling stage is provided and operates in an oversampling mode and generates a digital output signal with a word length 1. The sampling stage is connected between the limiter and the digital signal processing section.

Moreover, the invention is aimed at specifying a method for processing a received signal in a cordless communication system that permits signal processing with high power efficiency.

The conversion of the analog signal into a digital signal is preferably carried out by a limiter and a sampling stage, which is operated in the oversampling mode. As a result, the analog signal is digitized in a way that is low in terms of expenditure. The group delay distortion caused by the (analog) channel selection filter is cancelled out or compensated by the group delay equalizers contained in the digital signal processing section. This ensures that the signal on which the further signal processing (in particular demodulation) is based is freed of group delay distortions, making possible signal demodulation with a comparatively small number of errors. The group delay equalizer is preferably an allpass filter.

One advantageous refinement of the invention is characterized in that a digital decimation filter stage is connected upstream of the group delay equalizer in the signal path, and in that the group delay equalizer is also configured to equalize signal distortions caused by the digital decimation filter stage. In this case, additional group delay distortions that are caused in the digital signal processing section by the decimation filter stage are therefore also included and compensated by the group delay equalizer. The filtering out of high-frequency signal faults caused by the nonlinearity of the limiter can be carried out here by the decimation filter stage.

One advantageous development of the receiver circuit is implemented in that in addition the digital signal processing section includes an amplitude equalizer for equalizing the amplitude distortions caused by the channel selection filter. As a group delay equalizer has a constant absolute-value frequency response (i.e. does not carry out any amplitude equalization), this is also the only way in which the amplitude distortion of the channel selection filter is compensated.

Other features which are considered as characteristic for the invention are set forth in the appended claims.

Although the invention is illustrated and described herein as embodied in a receiver circuit and a method of processing a received signal, is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
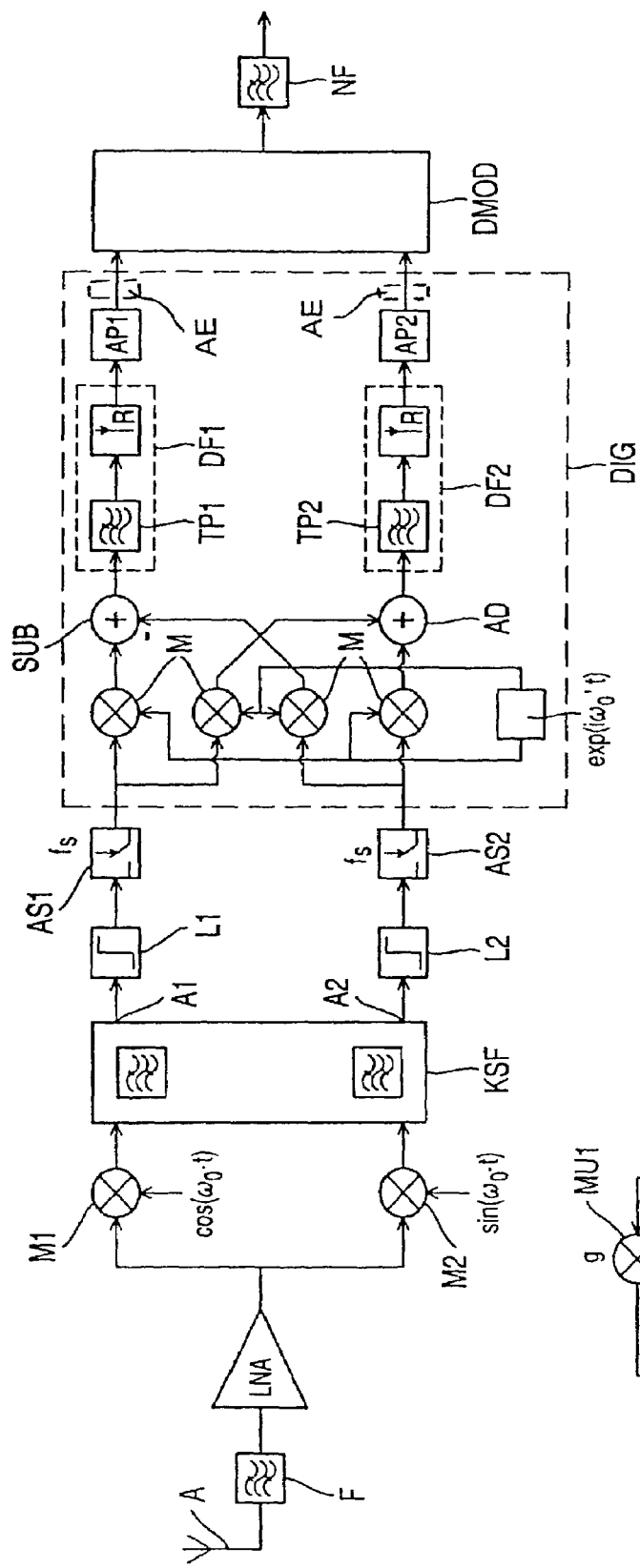
FIG. 1 is a schematic circuit diagram of a receiver circuit according to the invention.

Referring now to the figures of the drawing in detail and first, particularly, to FIG. 1 thereof, there is shown by way of example, the configuration of a receiver circuit according to the invention which can be used, for example, in DECT, WDCT, Bluetooth, SWAP, WLAN IEEE802.11 (frequency jump method).

A radio signal is picked up by an antenna A and fed to a low-noise input amplifier LNA (low-noise amplifier) via an input filter F. The input amplifier LNA amplifies the radio-frequency antenna signal with an adjustable gain. After the low-noise gain, the amplified signal is converted to an intermediate frequency. For this purpose, the output signal of the low-noise amplifier LNA is fed to two mixers M1 and M2. The mixers M1 and M2 are operated in a known fashion with a phase shift of 90° with a mixing frequency that is derived from a non-illustrated local oscillator. The two signals which are used to operate the mixers M1 and M2 correspond in their time dependence $\cos(\omega_0 t)$ and $\sin(\omega_0 t)$, $\omega_0$ designating the annular frequency assigned to the oscillator frequency and t designating the time.

In phase (I) and quadrature (Q) signals are available at the outputs of the mixers M1 and M2 in a reduced frequency position, referred to below as intermediate frequency (IF).

The outputs of the two mixers M1 and M2 are fed to an I or Q signal input of an analog channel selection filter KSF which is used for mirror frequency suppression. By use of the channel selection filter KSF, a specific frequency channel is selected and as a result the desired user signal is selected from the broadband signal/interference signal mixture which is present at the input end.

The two I and Q signal components are output with the bandwidth of the user channel at two outputs A1, A2 of the channel selection filter KSF.

The output A1 of the channel selection filter KSF is connected to an input of a first limiter L1, and the output A2 is connected to an input of a second, structurally identical limiter L2.

The outputs of the limiters L1 and L2 are connected to respective inputs of a first and second sampling stage AS1 and AS2. The digital signal processing starts in the signal path downstream of the sampling stages AS1 and AS2.

The combination of the limiter (L1 to L2) and sampling stage AS1 and AS2) represents an analog/digital converter with a word length 1. The method of operation of this combination of limiter and sampling stage, i.e. L1, AS1 and L2, AS2, is now described. The limiter L1, L2 cuts off all the input levels above a predefined limiter level threshold, i.e. it generates an output signal with a constant signal level in the cutoff range. If the limiter L1, L2 has, in the present case, a high gain and/or a low limiter level threshold, it is operated virtually continuously in the cutoff or limiter range. As a result, a signal that has a discrete value (binary) but is still continuous over time is already present at the output of the limiter L1, L2. The user information of the I and Q signal components at the outputs of the limiters L1 and L2 is at the zero crossovers of these signal components.

The two sampling stages AS1, AS2 that are implemented as single-bit samplers sample the analog signal components with discrete value at a rate $f_s$. The sampling is carried out in an oversampling mode with respect to a channel bandwidth (i.e. the bandwidth of the signal below the channel selection filter KSF).

For example, the channel bandwidth can be 1 MHz and the sampling can be carried out with $f_s$=104 MHz, i.e. oversampling by the factor 104 can be carried out.

One advantage of the analog/digital conversion is that amplitude faults of the user signal are suppressed by the limiter L1, L2.

The digitized I and Q signal components are fed to a digital signal processing section which is designated by DIG in FIG. 1.

The digital signal processing section DIG contains a complex digital mixer and a decimation filter cascade DF1 and DF2 at the output end of the digital mixer in each signal branch, as well as an allpass filter AP1 and AP2 in the signal path downstream thereof. The decimation filter cascades DF1 and DF2 as well as the allpass filters AP1 and AP2 each have identical structures.

The I and Q signal outputs of the allpass filters AP1, AP2 are fed to the corresponding inputs of a suitable demodulator DMOD. In a general case, the demodulator DMOD may be a continuous phase modulation (CPM) demodulator. The latter estimates the data symbols of the transmitted data symbol sequence from the signal components fed to its inputs, i.e. from the instantaneous phase or the instantaneous frequency of these signal components.

At the output end, the demodulator DMOD is connected to a filter NF that carries out output filtering of the estimated data symbols.

The method of operation of the digital signal processing section DIG that is illustrated in FIG. 1 is now further explained. The digital mixer has four complex multipliers M as well as an adder AD and a substractor SUB. Its function consists in downmixing the received I and Q intermediate frequency signal components into the baseband. For this purpose, the multipliers M are operated with a periodic signal $\exp(i\omega_0' t)$ with a suitable annular frequency $\omega_0'$. Here, i designates the imaginary unit.

Downstream of the subtractor SUB or the adder AD there are in each case signals with a word length greater than 1, for example with a word length of 6 or 8.

In the decimation filter cascade DF1, DF2, the radio-frequency faults that are caused by the nonlinearity of the limiter L1 or L2 are filtered out (for this purpose each decimation filter cascade DF1 and DF2 has at least one low-pass filter TP1 and TP2), and reduces the sampling rate by the factor R to $f_s/R$. For example, R=8 may be true.

In each case one group delay equalization is carried out on the signals with a reduced sampling rate by the allpass filters AP1, AP2. A transmission function $H_{equal}(z)$ of the allpass filters AP1, AP2 is selected here in such a way that the group delay distortion caused by the channel selection filter KSF (i.e. the distortion of that signal variable which is given by the time derivative of the signal phase; this is known to be referred to as group delay) is compensated. In addition, it is possible, by setting a correspondingly modified transmission function $H_{equal}(z)$, for the group delay distortion caused by the digital decimation filters DF1, DF2 to be taken into account in the equalization by the allpass filters AP1 and AP2.

Optionally, in each case an amplitude equalizer AE may be disposed downstream of the allpass filters AP1, AP2 for the purpose of amplitude equalization. As a result, distortions in the absolute value of the signal that are caused by the channel selection filter KSF can also be compensated.

Figure 2:
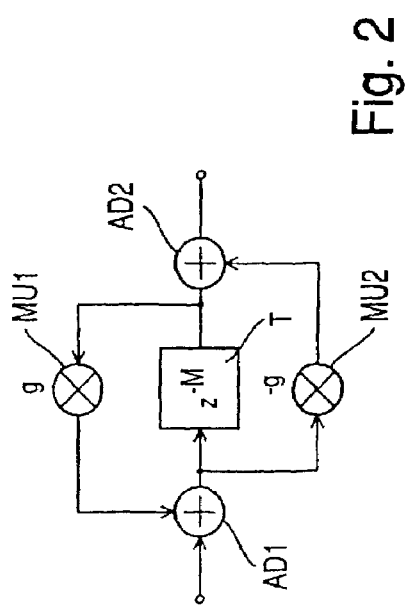
FIG. 2 is a schematic circuit diagram of an allpass filter.

FIG. 2 shows a specific exemplary embodiment of the allpass filter AP1, AP2. The allpass filter which is known as such has an adder AD1, AD2 at the input and output sides respectively, a delay element T with a signal delay of M sampling clocks being disposed in the signal path between the two adders AD1, AD2 ($z^{-1}$ designates the z transform of a delay by a sampling clock). The signal which is present at the output of the delay element T is fed back via a first multiplier MU1 to the multiplier g at the input-end adder AD1 and the signal made available at the output of the input-end adder AD1 is multiplied with the multiplier –g by a second multiplier MU2 and fed to the output-end adder AD2. The characteristic of the allpass filter can be set as desired by selecting g and M. The transmission function of the allpass filter is:

$$H_{equal}(z)=(z^{-M}-g)/(1-gz^{-M})$$

Furthermore, allpass filters in the form of cascades with a multiplicity of filter coefficients can be used.

We claim:

1. A receiver circuit for a cordless communication system, the receiver circuit comprising:
    an analog signal processing section having a channel selection filter;
    a digital signal processing section connected downstream of said analog signal process section, said digital signal processing section having a group delay equalizer for equalizing at least signal distortion caused by said channel selection filter;
    a limiter connected to said analog processing section; and
    a sampling stage operating in an oversampling mode and generating a digital output signal with a word length 1, said sampling stage connected between said limiter and said digital signal processing section.

2. The receiver circuit according to claim 1, wherein said group delay equalizer is an allpass filter.

3. The receiver circuit according to claim 1, wherein said digital signal processing section has a digital decimation filter stage connected upstream of said group delay equalizer in a signal path, said group delay equalizer equalizes signal distortions caused by said digital decimation filter stage.

4. The receiver circuit according to claim 1, wherein said digital signal processing section has an amplitude equalizer for equalizing the signal distortion caused by said channel selection filter.

5. The receiver circuit according to claim 1, wherein the cordless communication system uses FSK modulation.

6. A method for processing a received signal in a cordless communication system, which comprises the steps of:
    carrying out a channel selection using an analog channel selection filter;
    digitizing a received signal by signal limitation and oversampling of a limited signal, an output signal with a word length 1 being generated during the oversampling; and
    using a digital group delay equalizer for equalizing signal distortion caused by the analog channel selection filter.

7. The method according to claim 6, which further comprises performing filtering and decimation upstream of the digital group delay equalizer in a signal path, and the digital group delay equalization also includes equalization of signal distortions caused by the filtering and decimation.

8. The method according to claim 6, which further comprises performing amplitude equalization to equalize signal distortion caused by the analog channel selection filter.

9. The method according to claim 6, which further comprises frequency shift key modulating the received signal.

* * * * *